United States Patent
Kwon et al.

(10) Patent No.: US 7,512,296 B2
(45) Date of Patent: Mar. 31, 2009

(54) LONG CAVITY SINGLE-MODE LASER DIODE

(75) Inventors: Oh Kee Kwon, Daejeon (KR); Jonghoi Kim, Daejeon (KR); Kwang Ryong Oh, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 101 days.

(21) Appl. No.: 11/768,470

(22) Filed: Jun. 26, 2007

(65) Prior Publication Data

US 2008/0019638 A1      Jan. 24, 2008

(30) Foreign Application Priority Data

Jul. 18, 2006    (KR) .................. 10-2006-0067092

(51) Int. Cl.
G02B 6/12      (2006.01)
(52) U.S. Cl. .............. 385/14; 385/24; 385/37; 359/349
(58) Field of Classification Search ............ 385/14, 385/24, 37; 359/349
See application file for complete search history.

(56) References Cited

U.S. PATENT DOCUMENTS

| | | | |
|---|---|---|---|
| 6,504,969 B1 * | 1/2003 | Tsao et al. ................ | 385/24 |
| 6,931,036 B2 | 8/2005 | Thourhout | |
| 2003/0118303 A1 | 6/2003 | Evans | |
| 2007/0133649 A1 * | 6/2007 | Kwon et al. ............. | 372/102 |

FOREIGN PATENT DOCUMENTS

| GB | 2391692 | 2/2004 |
|---|---|---|
| JP | 05-063265 | 3/1993 |
| JP | 10-170878 | 6/1998 |
| JP | 2002-303899 | 10/2002 |
| KR | 1020040034773 | 4/2004 |

OTHER PUBLICATIONS

C.H. Joyne, et al; "An 8-Channel Digitally Tunable Transmitter with Electroabsorption Modulated Output by Selective-Area Epitaxy;" IEEE Photonics Technology Letters, IEEE Service Center, Piscataway, NJ, US, vol. 7, No. 9, Sep. 1, 1995, pp. 1013-1015.
C.R. Doerr; "Characteristics of shared dispersive element WDM Lasers;" Lasers and Electro-Optics Society Annual Meeting, 1997. Leos '97 10th Annual Meeting, Conference Proceedings, IEEE san Francisco, CA USA Nov. 10-13, 1997, vol. 2, pp. 232-233.

(Continued)

*Primary Examiner*—Jennifer Doan
(74) *Attorney, Agent, or Firm*—Ladas & Parry LLP

(57) ABSTRACT

Provided is a long cavity single-mode laser diode in which a ring waveguide is integrated such as a conventional array waveguide (AWG)-based laser or a concave grating (CG)-based laser.

5 Claims, 9 Drawing Sheets

OTHER PUBLICATIONS

E.A.J.M. Bente, et al; "Simulation of semiconductor mode-locked ring lasers with monolithically integrated passive pulse shaping elements;" Numerical Simulation of Optoelectronic Devices, 2005. NUSOD '05. Proceedings of the 5th International Conference on Berlin, Germany Sep. 19-22, 2005, pp. 107-108.

L. Moller, et al; "Multifrequency laser based on integrated Vernier-Michelson cavity for mode stabillsation;" Electronics Letters, IEE Stevenage, GB vol. 36, No. 6, Mar. 16, 2000, pp. 540-542.

J.H. den Bester, et al; "An Integrated 4×4-Channel Multiwavelength Laser on InP;" IEEE Photonics Technology Letters, IEEE Service Center, Piscataway, NJ, US, vol. 15, No. 3, Mar. 2003, pp. 368-370.

Oh Kee Kwon, et al; "Monolithically Integrated Grating Cavity Tunable Lasers;" IEEE Photonics Technology Letters, IEEE Service Center, Piscataway, NJ, US, vol. 17, No. 9, Sep. 2005, pp. 1794-1796.

Oh Kee Kwon, et al; "Monolithically Integrated Multiwavelength Grating Cavity Laser;" IEEE Photonics Technology Letters, IEEE Service Center, Piscataway, NJ US, vol. 17, No. 9, Sep. 2005, pp. 1788-1790.

K.R. Poguntke, et al; "Design of a Multistripe Array Grating Integrated Cavity (MAGIC) Laser;" Journal of Lightwave Technology, IEEE Service Center, New York, Ny, US. vol. 11, No. 12, Dec. 1, 1993 pp. 2191-2200.

Dominik G. Rabus, et al; "MMI-Coupled Ring Resonators in GaInAsP-InP;" IEEE Photonics technology Letters, IEEE Services Center, Piscataway, NJ, US, vol. 13, No. 8, Aug. 2001.

Soole, J.B.D., et al. (1991). "Monolithic InP/InGaAsP/InP grating spectrometer for the 1.48-1.56 μm wavelength range". *Appl. Phys. Lett.* 58 (18). pp. 1949-1951.

Kwon, O.K., et al. (2005). "Monolithically Integrated Multiwavelength Grating Cavity Laser". *IEEE Photonics Technology Letters*. vol. 17, No. 9, pp. 1788-1790.

Kwon, O.K., et al. (2005). "Monolithically Integrated Grating Cavity Tunable Lasers". *IEEE Photonics Technology Letters*. vol. 17, No. 9. pp. 1794-1796.

Bogatov, A.P., et al. (1975). "Anomalous Interaction of Spectral Modes in a Semiconductor Laser." *IEEE Journal of Quantum Electronics*. vol. QE-11, No. 7. pp. 510-515.

Kazarinov, R.F., et al. (1982). "Longitudinal mode self-stabilization in semiconductor lasers." *J.App.Phys.* 53(7). pp. 4631-4644.

Doerr, C.R. (1997). "Theoretical Stability Analysis of Single-Mode Operation in Uncontrolled Mode-Selection Semiconductor Lasers." *IEEE Photonics Technology Letters*. vol. 9, No. 11. pp. 1457-1459.

Doerr, C.R., et al. (1995). "Single Longitudinal-Mode Stability Via Wave Mixing in Long-Cavity Semiconductor Lasers." *IEEE Photonics Technology Letters*. vol. 7, No. 9, pp. 962-964.

Zirngibl, M., et al. (1994). "Characterization of a Multiwavelength Waveguide Grating Router Laser". *IEEE Photonics Technology Letters*. vol. 6, No. 9, pp. 1082-1084.

Rabus, D.G., et al. "MMI-Coupled Ring Resonators in GaInAsP-InP". *IEEE Photonics Technology Letters*. vol. 13, No. 8. pp. 812-814.

Möller, et al. (2000). "Mode stabilization technique for the multifrequency laser". *Optical Fiber Communication Conference.* TuL4-1. Meeting date: Mar. 7, 2000-Mar. 10, 2000, Location: Baltimore MD. pp. 187-189.

Besten, J.H. (2003). "An Integrated 4×4-Channel Multiwavelength Laser on InP". *IEEE Photonics Technology Letters*. vol. 15, No. 3. pp. 368-370.

Thourhout, D.V., et al. (2003). "Compact Digitally Tunable Laser." *IEEE Photonics Technology Letters*. vol. 15, No. 2. pp. 182-184.

Möller, et al. (2000). "Multifrequency laser based on integrated Vernier-Michelson cavity for mode stabilisation". *Electronics Letters*. vol. 36, No. 6. pp. 540-542.

Zirngibl, M., et al. (1994). "Digitally Tunable Channel Dropping Filter/Equalizer Based on Waveguide Grating Router and Optical Amplifier Integration". *IEEE Photonics Technology Letters*. vol. 6, No. 4. pp. 513-515.

* cited by examiner

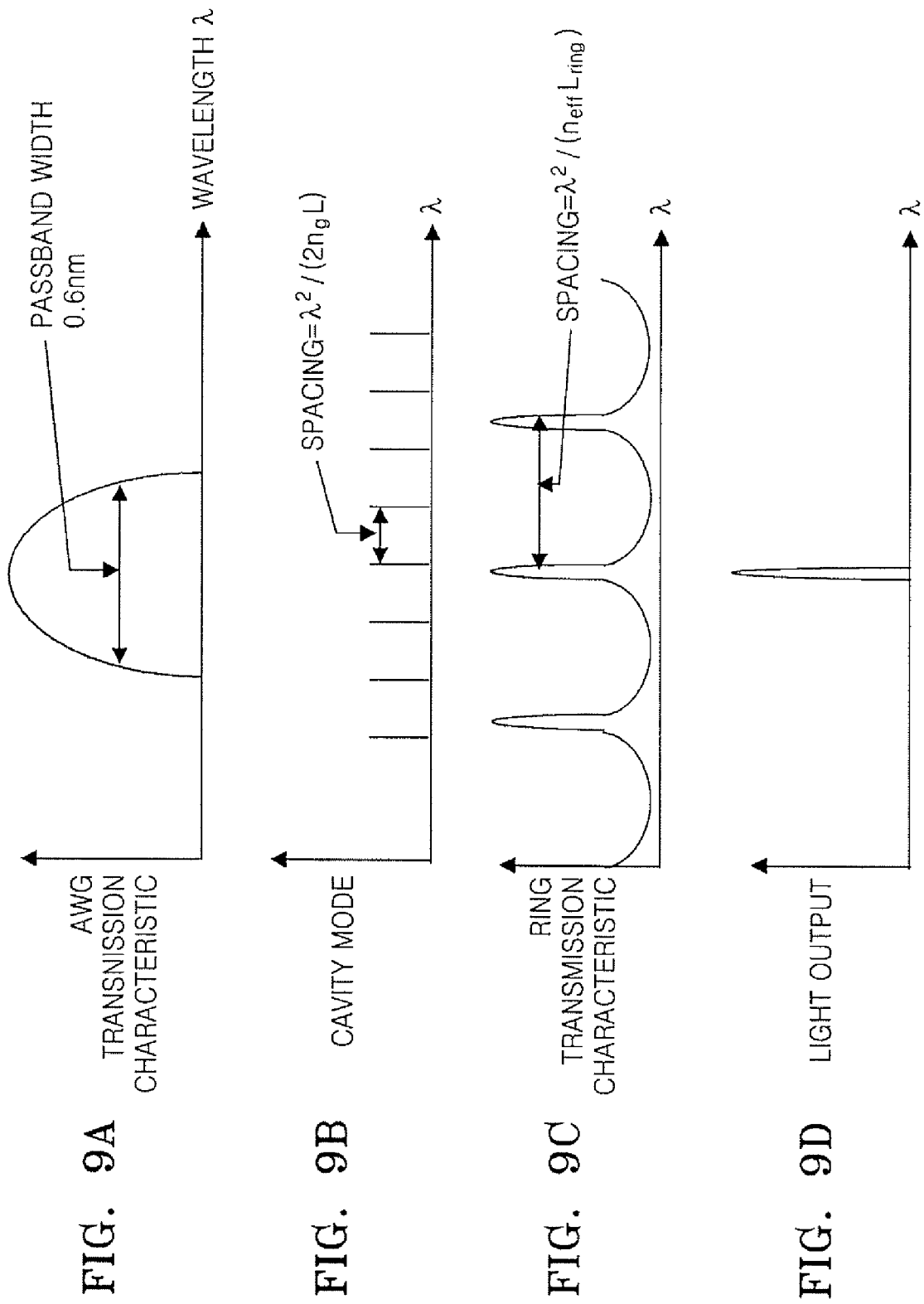

LONG CAVITY SINGLE-MODE LASER DIODE

CROSS-REFERENCE TO RELATED PATENT APPLICATION

This application claims the benefit of Korean Patent Application No. 10-2006-0067092, filed on Jul. 18, 2006 in the Korean Intellectual Property Office, the disclosure of which is incorporated herein in its entirety by reference.

BACKGROUND OF THE INVENTION

1. Field of the Invention

The present invention relates to a long cavity single-mode laser diode having improved longitudinal single-mode stability.

2. Description of the Related Art

A longitudinal single-mode semiconductor laser diode is an essential optical component used in coherent optical communication or in wavelength division multiplexing optical communication.

In general, a filter or grating that works as a wavelength selector is inserted into a cavity to obtain a single-mode in a semiconductor diode having a longitudinal multi-mode, for example, a Fabry-Perrot laser diode.

Various methods of obtaining a single-mode have been reported, and laser diodes can be classified into short cavity laser diodes and long cavity laser diodes. Examples of short cavity laser diodes include distributed feedback laser diodes (DFB-LDs) and distributed Bragg reflector laser diodes (DBR-LDs). Short cavity laser diodes include a grating having a longitudinal refractive index or gain periodicity in a cavity, thereby obtaining a longitudinal single-mode.

Other examples of short cavity laser diodes are distributed reflector laser diodes (DR-LDs), coupled cavity laser diodes (CC-LDs), etc., which have a relatively short length (1 mm or less), thus having high direct modulation speed, and a mode spacing (inversely proportional to the length of the device) is broader than the spectral bandwidth of the grating or filter, and thus a single-mode can be easily obtained.

Long cavity laser diodes can be classified into arrayed waveguide grating-based laser diodes (AWG-based LDs) and concave grating-based laser diodes (CG-based LDs).

AWG-based laser diodes are light sources composed of a semiconductor optical amplifier (SOA) and an AWG which are monolithic-integrated and functioning as a single-mode light source, and CG-based laser diodes include an SOA and a concave grating in monolithic integration.

Long cavity laser diodes include an SOA generating optical gain and an AWG or CG performing wavelength selection in monolithic integration; however, the length of cavities spaced apart from each other is several mm, which is relatively greater than short cavity laser diodes. Thus, the modulation speed is low due to the long round-trip time in the cavities.

Since long cavity laser diodes can be easily manufactured as an array type, they can be used as multi-wavelength laser sources, and can be easily integrated with optical modulators, optical attenuators, and optical detectors, etc., thus having a wide usage range.

FIG. 1 is a schematic view of a conventional AWG-based laser. Referring to FIG. 1, the AWG-based laser is formed of an SOA pre-amp 100, an AWG 110, and a wavelength selection SOA array 120. The SOA pre-amp 100 and the wavelength selection SOA array 120 generate optical gain by applied current, and the AWG 110 selects wavelength.

When a current is injected into the SOA pre-amp 100, optical gain is generated to generate light in a broad wavelength range, and the generated light passes through the AWG 110 and is guided as light having different wavelengths along a output waveguide array by the dispersion characteristics of the AWG 110.

When a current is injected to the wavelength selection SOA array 120, guided beams obtain optical gain to reach a facet on the right side of the wavelength selection SOA array 120 and are reflected back to the AWG 110 and the SOA pre-amp 100. A facet on the left side of the SOA pre-amp 110 and a facet of the right side of the wavelength selection SOA array 120 function as a cavity, and light is outputted through the left facet of the SOA pre-amp 100. (Of course, light is also outputted through the SOA array 120.) When no current is injected to the wavelength selection SOA array 120, guided beams are absorbed and no light is outputted. Accordingly, in FIG. 1, the SOA pre-amp 100 is always switched on, and a beam at a predetermined wavelength can be outputted to the left facet of the SOA pre-amp 100 by injecting current to at least one of the wavelength selection SOA array 120.

FIGS. 2A through 2D illustrate operating characteristics in wavelength domain of the AWG-based laser in FIG. 1.

The wavelength selection transmission characteristics of the AWG 110 has a width of about 0.4 nm to 0.8 nm (50 GHz to 100 GHz) as illustrated in FIG. 2A. The length L of the cavity of the total device is at least 2 mm or greater, the operating wavelength $\lambda$ is 1550 nm, and the group refractive index ng of the waveguide is 3.7, and the cavity mode spacing $(\Delta\lambda)(=\lambda2/(2 ngL))$ is about 0.16 nm, which is shorter than the width of the passband of the AWG 110 as illustrated in FIG. 2B.

When the AWG-based laser is resonated only by the transmission characteristics of the AWG 110, a multi-mode can be predicted as illustrated in FIG. 2C. However, a single-mode can also appear in predetermined conditions as illustrated in FIG. 2D and based on experimental data (Reference 1: M. Zinrngibl et al, "Digitally tunabel laser based on the integration of a waveguide grating multiplexer and an optical amplifier," IEEE Photon. Technol. Lett., vol. 6, no. 4, pp. 516-518, April 1994, Reference 2: M. Zirngibl et al, "Characterization of a multiwavelength waveguide grating router laser," IEEE Photon. Technol. Lett., vol. 6, no. 9, pp. 1082-1084, September 1994), and this is due to the change in optical gain spectrums by nonlinear characteristic inside the SOA (Reference 3: C. R. Doerr, et al, "Single longitudinal-mode stability via wave mixing in long-cavity semiconductor lasers," IEEE Photon. Technol. Lett., vol. 7, no. 9, pp. 962-964, September 1995, Reference 4: C. R. Doerr, "Theoretical stability analysis of single-mode operation in uncontrolled mode-selection semiconductor lasers," IEEE Photon. Technol. Lett., vol. 9, no. 11, pp. 1457-1459, November 1997).

In detail, the nonlinear characteristic of the SOA pre-amp 100 is caused by self-stabilization (Reference 5: R. F. Kazarinov, et al, "Longitudinal mode self-stabilization in semiconductor laser," J. Appl. Phys. vol. 53, no. 7, pp. 4631-4644, July 1982) and four-wave mixing (Reference 6: A. P. Bogatov, et al, "Anomalous interaction of spectral modes in a semiconductor laser," IEEE J. Quantum Electron., vol. QE-11, no. 7, pp. 510-515, July 1975).

Self-stabilization refers to a characteristic of the laser oscillating at a predetermined wavelength to maintain the present oscillating state. When the wavelength of the peak value of the transmission characteristic of the AWG 110 in FIG. 2A corresponds to a predetermined wavelength of the cavity mode, the optical gain value at this wavelength becomes significantly greater than the optical gain value of the adjacent cavity mode, thereby increasing the light output of the oscillation mode. Four-wave mixing occurs when the optical gain of the long wavelength side increases at a faster rate than the optical gain of the short wavelength side while beating two or more modes of light when the wavelengths of the AWG transmission characteristic peak value and of the cavity mode do not correspond to each other. About 30 dB or greater side mode suppression ratio (SMSR) can be obtained by the above-mentioned nonlinear characteristic.

FIG. 3 is a schematic view of a conventional CG-based laser. Referring to FIG. 3, the CG-based laser (Reference 7: Oh-kee Kwon et al, "Monolithically integrated grating cavity tunable laser," IEEE photon. Technol. Lett., vol. 17, no. 9, pp. 1794-1796, 2005) is formed of an SOA 300, a phase control section (PCS) 310, a dispersive element (DE) 320, and a concave grating (CG) 330.

The SOA 300 generates optical gain by injected current (ISOA), and the PCS 310 controls the phase of guiding beams by current injection (IPCS), the DE 320 varies the wavelength by the current application (IDE), and the CG 330 selects the wavelength as described with reference to FIG. 1. The CG-based laser illustrated in FIG. 3 is used as a single-mode light source, and can be used at the same time as a wavelength modulation light source by changing the wavelength of the oscillation beam by current application to the DE 320.

When current is injected to the SOA 300, optical gain is generated and light in a broad wavelength range is generated, the generated light passes through the PCS 310, and beams are spread at point A and incident to the CG 330. Only beams at predetermined wavelengths which are incident on the CG 330 are reflected in the same direction as the incident beams by the diffracting characteristic of the grating. The reflected beams are gathered at point A to be reflected back to the PCS 310 and the SOA 300.

Since the left facet of the SOA 300 and a facet of the CG 330 function as a cavity, light is output to the left cross-section of the SOA 300. The CG-based wavelength variation light source can be formed in various shapes except the DE 320 (Reference 8: Oh-kee Kwon et al, "Monolithically integrated multi-wavelength grating cavity laser," IEEE photon. Technol. Lett., vol. 17, no. 9, pp. 1788-1790, 2005, Reference 9: J. B. D Soole, et al, "Monolithic InP/InGaAsP/InP grating spectrometoer for the 1.48-1.56 µm wavelength range," Appl. Phys. Lett. vol. 58, no. 18, pp. 1949-1951, May 1991).

The CG 330 functions as the AWG, and thus an operating characteristic of the CG-based laser is the same as that illustrated in FIGS. 2A through 2D. That is, FIG. 2A corresponds to the diffracting reflection characteristic, FIG. 2B corresponds to the cavity mode characteristics, and FIG. 2D corresponds to the light output characteristics. The CG-based laser can also obtain a side mode suppression ratio of 30 dB or greater due to the nonlinearity of the SOA.

FIGS. 4 and 5 illustrate the light output characteristic of the CG-based laser in FIG. 3 when current is injected.

Referring to FIG. 4, the light output spectrum of the CG-based laser in FIG. 3 (length of the SOA: 800 µm, the length of the cavity: about 4 mm, the diffraction order of the CG: four) measured when the injection current ISOA is 10 mA. The light output is obtained through optical fiber and shows high side mode suppression ratio of about 35 dB or greater.

Referring to FIG. 5, when the injection current (ISOA=300 mA) to the CG-based laser is increased, a multi-mode is generated. The multi-mode is generated more easily when the operating current with respect to an identical structure is increased because high injection current saturates the optical gain of a main mode, and thus nonlinear characteristics cannot contribute to mode selection, which is illustrated in FIG. 2C.

When the CG-based laser is manufactured in a structure having a broad diffracting reflection characteristic of the CG (a structure with a lower diffraction order, long grating period, and short distance between point A and the cross-section of the concave grating, etc.), a multi-mode is generated even with respect to low injection current.

The single-mode characteristic of the long cavity laser diodes relies on the nonlinear characteristic of the SOA, and the nonlinear characteristic is significantly influenced by the structure of the device and the operating conditions, and this indicates that the single-mode stability is not good. Recently, various methods have been suggested to overcome such problems. First, two different AWGs and optical couplers are used to overlap each AWG passband to obtain a good quality single-mode (Reference 10: D. Van Thourhout et al, "Compact digitally tunable laser," IEEE Photon. Tech. Lett., vol. 15, no. 2, pp. 182-184, February 2003, Reference 11: J. H. den Besten et al, "An integrated 4-channel multiwavelength laser on InP," IEEE Photon. Techonol. Lett. vol. 15, no. 3, pp. 368-370, March 2003).

Such structure is reported to have high side mode suppression ratio of about 40 dB, and moreover, to increase the number of channels significantly. However, such structure has a large size due to the two AWGs, and it is complicated to tune the passband of the two AWGs to obtain a single-mode. Also, a side peak occurs due to undesired wave-mixing effects.

Next, the single-mode stability can be improved by adding a DiDomenico-Seidel cavity (or Vernier-Michelson cavity) having a narrow filtering characteristic to an AWG-based laser (Reference 12: L. Moller et al, "Multifrequency laser based on integrated Vernier-Michelson cavity for mode stabilization," IEE Electron Lett. vol. 36, no. 6, pp. 540-542, 2000).

The structure can select only a cavity mode due to the filter characteristic of DiDomenico-Seidel cavity even when the width of the passband of the AWG is relatively wide, and thus an excellent single-mode characteristic is expected. However, in order to realize a DiDomenico-Seidel cavity in an AWG-based laser, elaborate design and fabrication are required, and the size of the device is increased, thereby increasing light loss.

SUMMARY OF THE INVENTION

The present invention provides a long cavity single-mode laser diode with improved longitudinal single-mode stability and small light loss without changing the size of the device and using a simple design and fabrication method.

According to an aspect of the present invention, there is provided a long cavity single-mode laser diode, comprising: a first optical amplifier amplifying and outputting beams; an array waveguide grating (AWG) separating the beams into a plurality of wavelengths along a waveguide array of the AWG; a semiconductor optical amplifier (SOA) array for wavelength selection amplifying light of each of the separated wavelengths; and a ring waveguide that is connected to the first optical amplifier and forms a feedback loop and comprises a second optical amplifier in the feedback loop.

According to another aspect of the present invention, there is provided a long cavity single-mode laser diode, comprising: a first optical amplifier amplifying and outputting beams; a PCS controlling the phase of the beams; a concave grating diffracting the beams in each wavelength according to an incident angle of the beams and reflecting the beams; and a ring waveguide that is connected to the first optical amplifier and forms a feedback loop and comprises a second optical amplifier in the feedback loop.

Accordingly, the stability of the single-mode can be considerably improved.

BRIEF DESCRIPTION OF THE DRAWINGS

The above and other features and advantages of the present invention will become more apparent by describing in detail exemplary embodiments thereof with reference to the attached drawings in which:

FIG. 9A through 9D illustrate operating characteristics of the AWG-based laser of FIG. 6;

DETAILED DESCRIPTION OF THE INVENTION

The present invention will now be described more fully with reference to the accompanying drawings, in which exemplary embodiments of the invention are shown.

Figure 1:
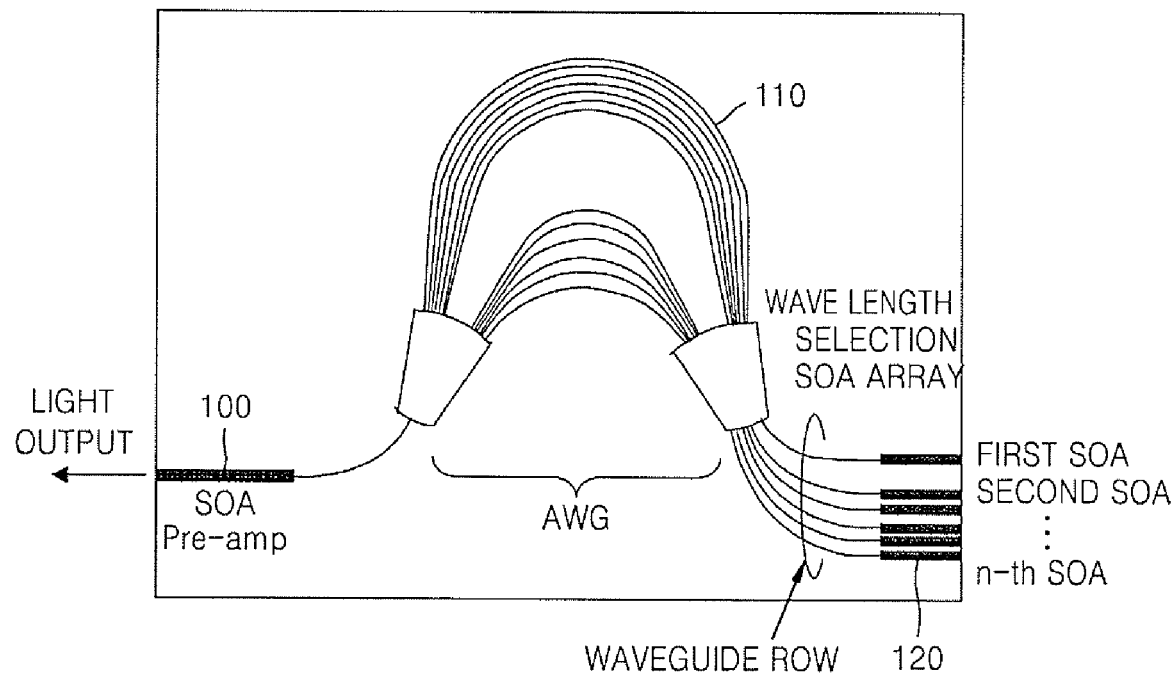
FIG. 1 is a schematic view of a conventional arrayed waveguide grating (AWG)-based laser.
Figure 2:
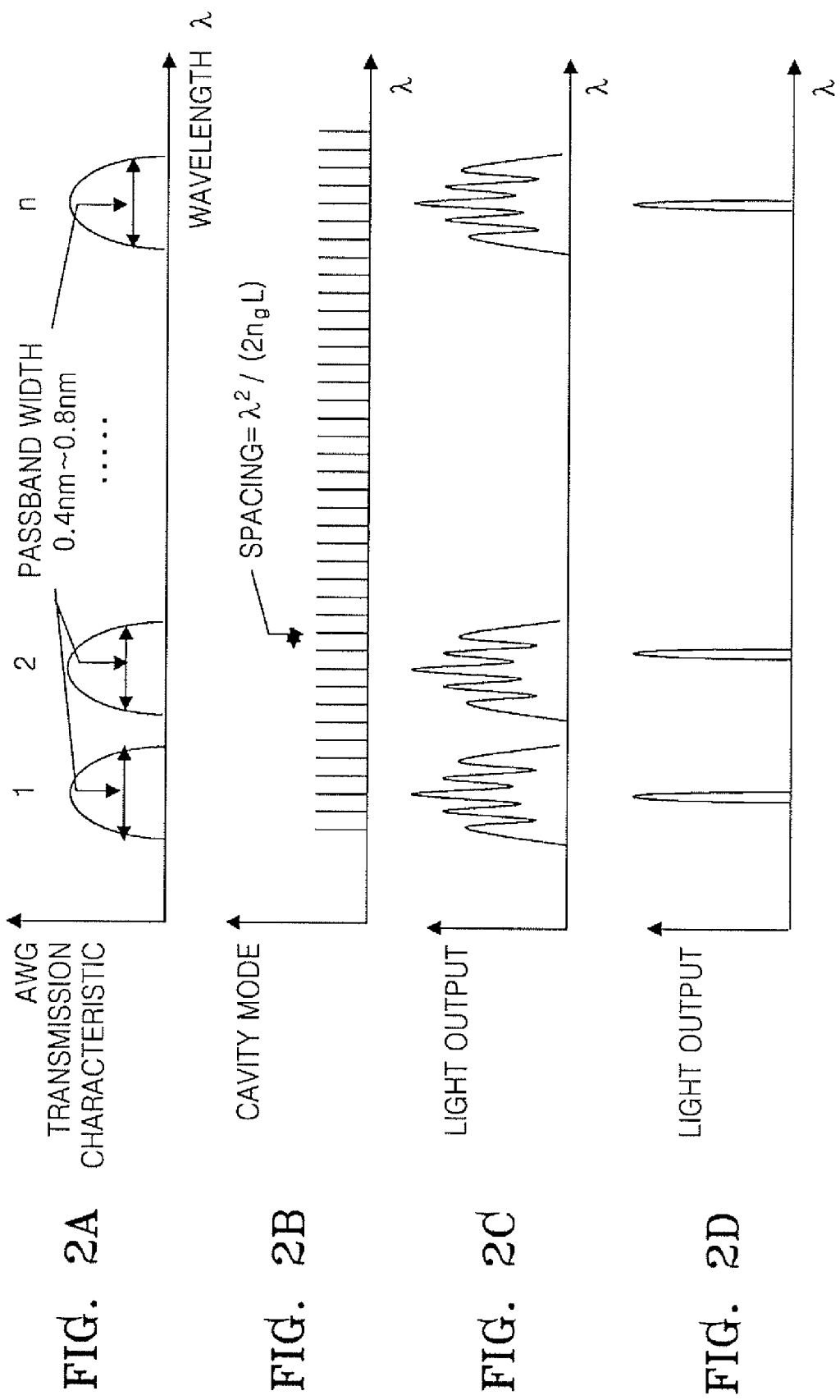
FIGS. 2A through 2D illustrate operating characteristics in wavelength domain of the AWG-based laser in FIG. 1 with respect to wavelength.
Figure 3:
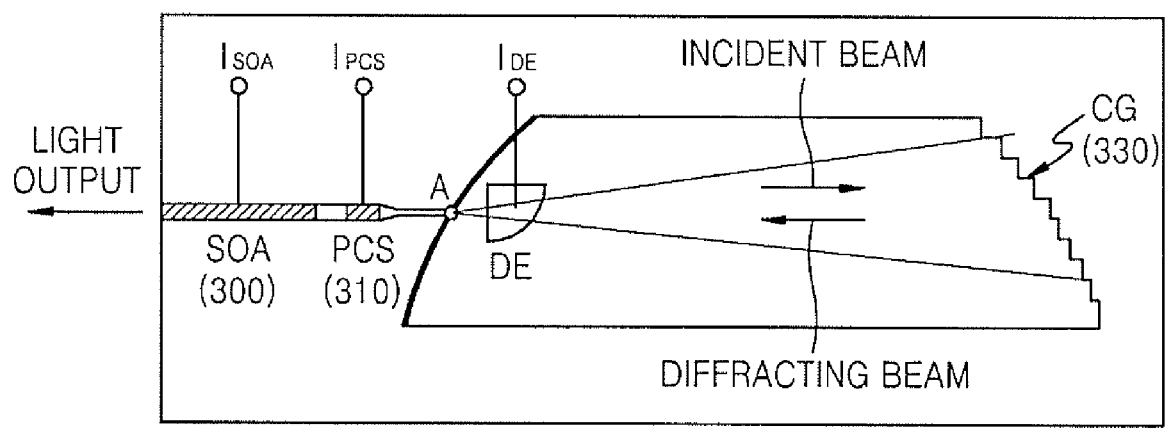
FIG. 3 is a schematic view of a conventional concave grating (CG)-based laser.
Figure 4:
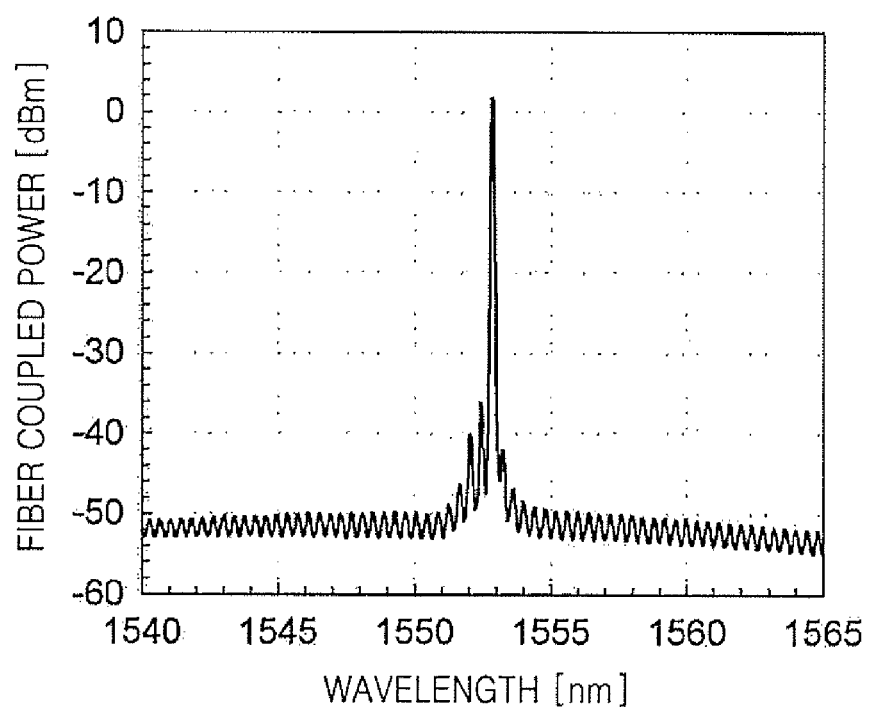
FIGS. 4 and 5 are graphs illustrating the light output characteristic of the CG-based laser in FIG. 3 when current is injected to the CG-based laser.
Figure 5:
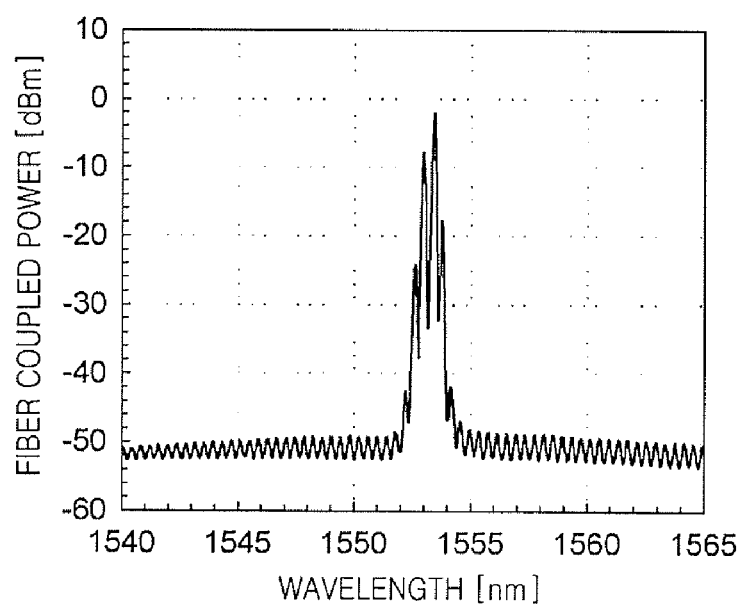
Figure 6:
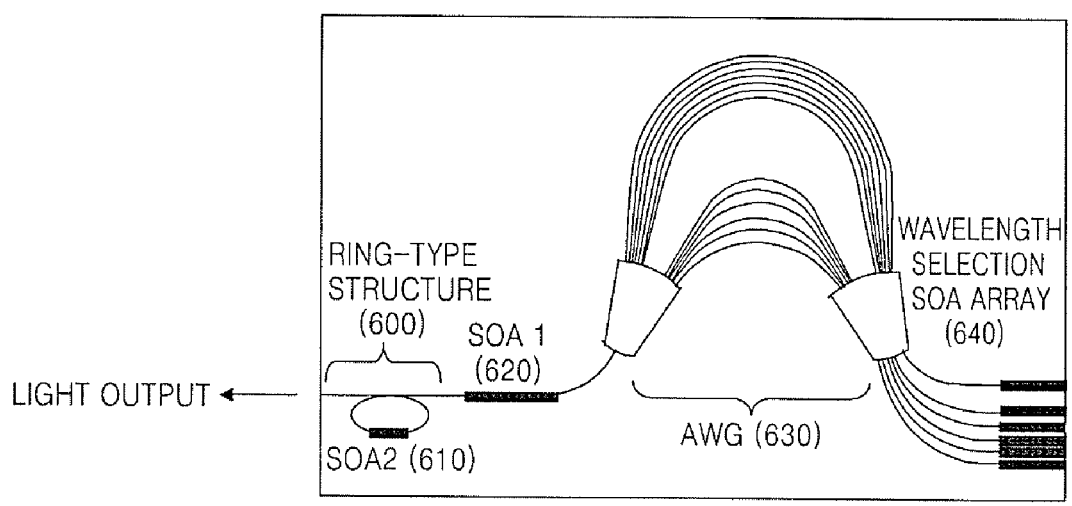
FIG. 6 illustrates an AWG-based laser in which a ring-type structure having an optical amplifier according to an embodiment of the present invention is integrated.
Figure 7A:
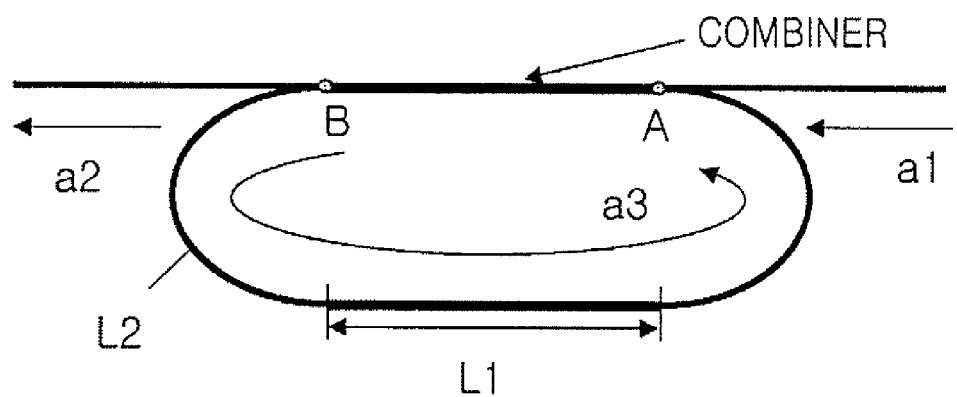
FIG. 7A illustrates a ring-type structure without an optical amplifier.
Figure 7B:
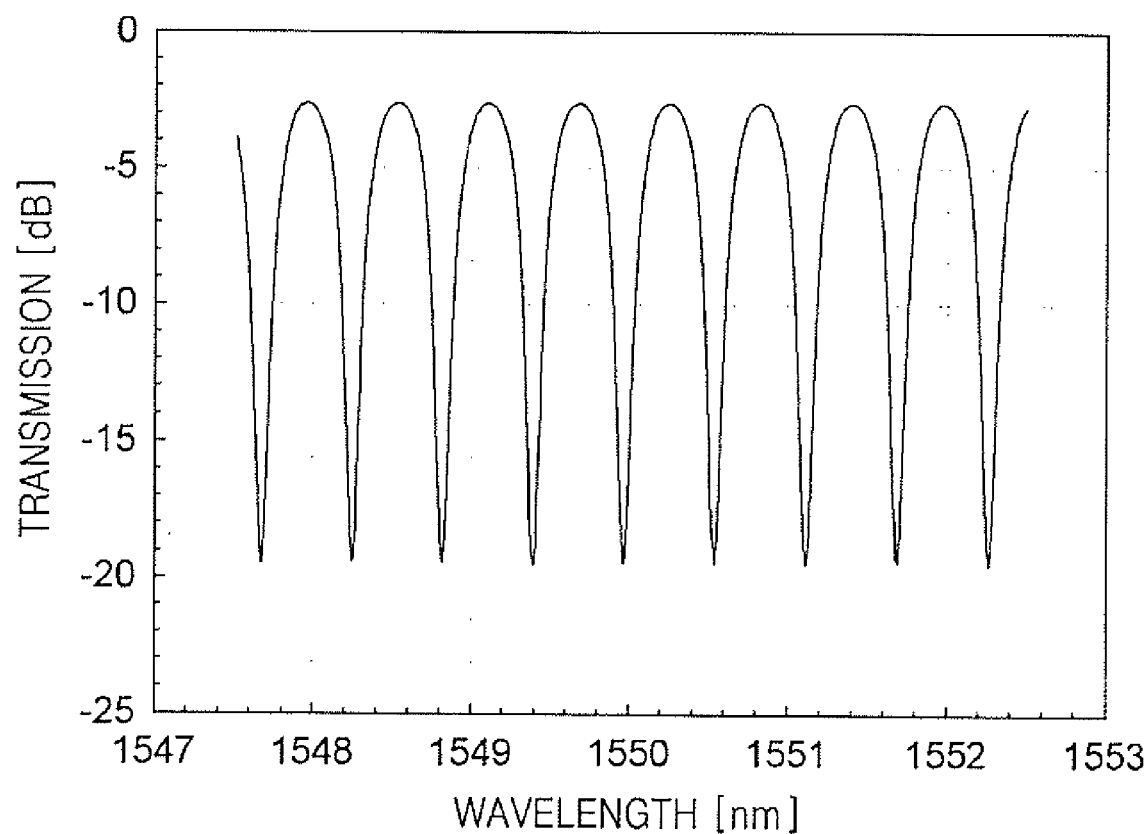
FIG. 7B is a graph illustrating operating characteristics of the ring-type structure of FIG. 7A.

FIG. 6 is a schematic view of an array waveguide grating (AWG)-based laser in which a ring-type structure 600 having an optical amplifier is integrated, according to an embodiment of the present invention. FIG. 7A illustrates a ring-type structure without an optical amplifier, and FIG. 7B is a graph illustrating an operating characteristics of the ring-type structure of FIG. 7A.

Referring to FIG. 6, the ring-type structure 600 is integrated in a conventional long cavity single-mode semiconductor. The ring-type structure 600 includes an additional optical amplifier (SOA2) 610 in a ring-type waveguide.

The ring-type filter is usually used as a band rejection filter (Notch filter) as described in Reference 13 ("D. G. Rabus et al, "MMI-coupled ring resonators in GaInAsP—InP," IEEE Photon. Technol. Lett., vol. 13, no. 8, pp. 812-814, August 2001").

Referring to FIG. 7A, in the ring-type structure without an optical amplifier, when an optical signal a1 is incident, the optical signal a1 is diverged into an optical signal a2 and an optical signal a3 at point B, and the optical signal a3 passes a ring-type waveguide and is combined with the optical signal a1 at point A. An optical combiner is used from point A to point B.

A ring type feedback loop in the ring type structure of FIG. 7A shows periodicity according to the phase conditions (constructive interference and destructive interference) of the optical signal a1 and the optical signal a3 for each wavelength, and when solved in a way to obtain general transmission characteristics (for example, Equation 3 in Reference 13), periodic transmission characteristic of a Notch filter as in FIG. 7B can be obtained. Since the intensity of the optical signal a3 is smaller than the optical signal a1, the transmission characteristic in FIG. 7B is negative.

The transmission characteristics of FIG. 7B with respect to the structure of FIG. 7A can be explained quantitatively as follows: If the loss of the combiner is 0 cm−1, the circumference Lring of the ring cavity except the length of the combiner (800 μm) is 1200 μm (L1=800 μm, 2*L2=400 μm), the effective refractive index neff of the waveguide is 3.49, and the loss of the ring cavity is 1 cm−1, the transmission width is about 17 dB (peak value: −3 dB, valley value: −20 dB) as illustrated in FIG. 7B, and the filtering characteristic of a wavelength spacing of 0.57 nm is shown. Here, in order to increase the transmission width, loss of the ring cavity should be reduced, and in order to increase or reduce the filtering spacing, the ring cavity circumference can be reduced or increased.

A ring-type filter is used to reject predetermined wavelengths, and thus the wavelength width of passing optical signals is relatively broad. Accordingly, when the ring-type structure of FIG. 7A is integrated in a conventional long cavity single-mode semiconductor laser, the effect of increasing single-mode stability is small due to the broad passband characteristic.

Figure 8A:
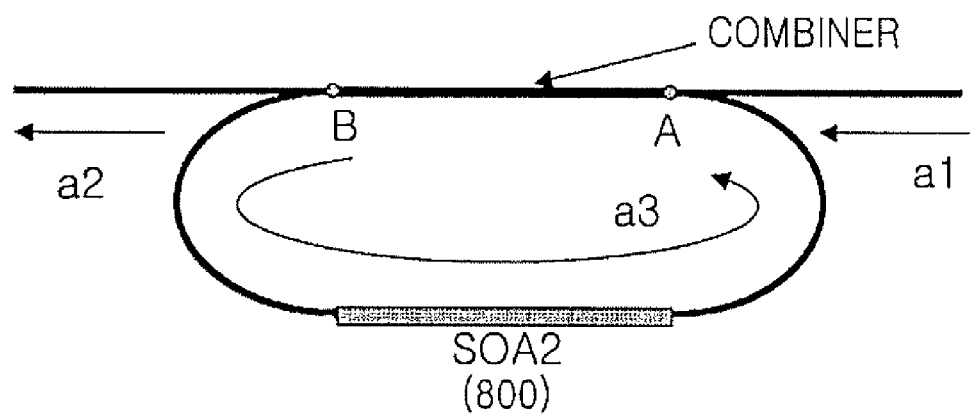
FIG. 8A illustrates a ring-type structure having an optical amplifier according to an embodiment of the present invention.
Figure 8B:
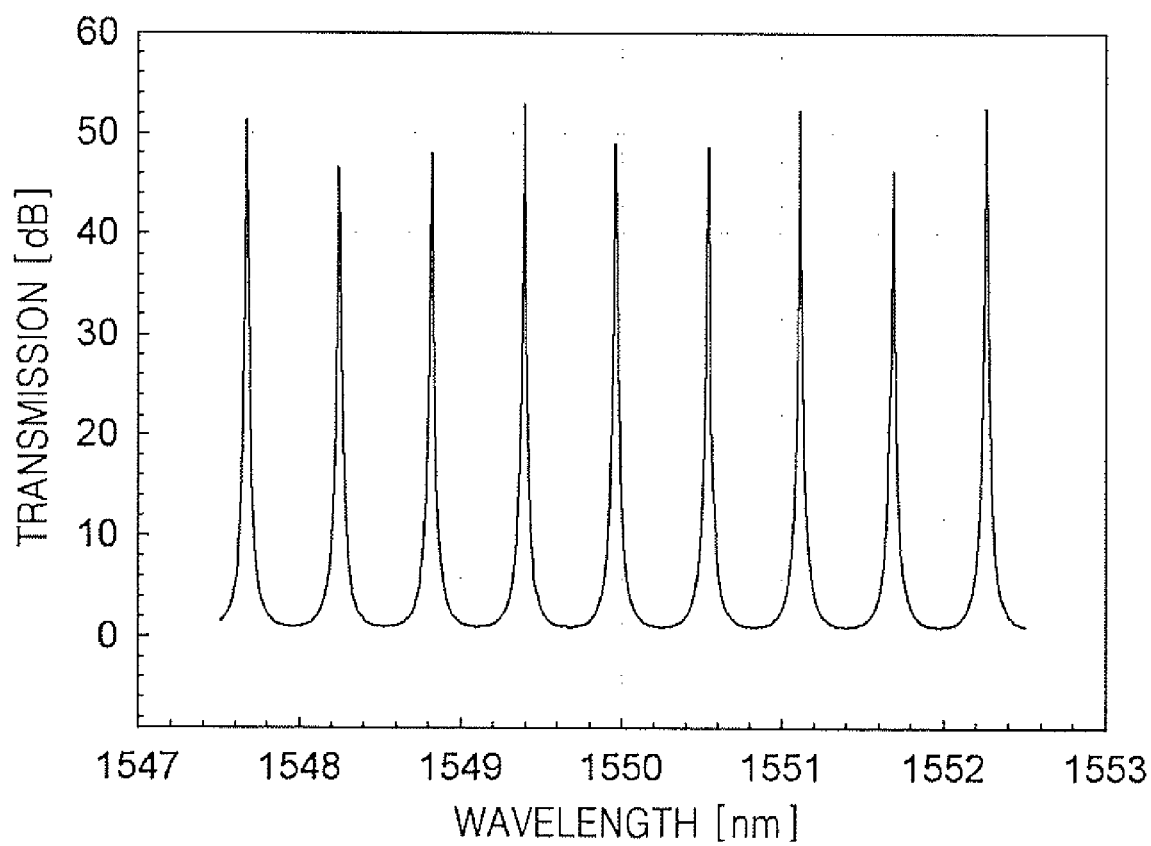
FIG. 8B is a graph illustrating operating characteristics of the ring-type structure.

FIG. 8A illustrates a ring-type structure with an optical amplifier according to another embodiment of the present invention, and FIG. 8B is a graph illustrating operating characteristics of the ring-type structure of FIG. 8A. Referring to FIG. 8A, an optical signal a3 is amplified by supplying current to an SOA2 800 to increase the intensity of the optical signal a3 to that of the optical signal a1 or greater. When the gain of the SOA2 800 is set as 0.3 cm−1, the transmission width is about 50 dB as illustrated in FIG. 8B.

Referring to FIG. 8B, the ring-type structure of FIG. 8A amplifies only predetermined wavelengths to transmit, and when the ring-type structure of FIG. 8A is integrated in a conventional long cavity single-mode semiconductor laser, single-mode stability can be increased efficiently.

Also, in the ring-type structure 600 of FIG. 6, a phase control selection (PCS) (not shown) is integrated between an SOA1 620 and the ring-type structure 600 or in the right side of the SOA1 620 or the left side of the ring-type structure 600, and the phase of beams emitted from the long cavity laser diode can be fixed to the maximum of the ring-cavity transmission characteristics.

FIGS. 9A through 9D illustrate operating characteristics of the AWG-based laser of FIG. 6 according to an embodiment of the present invention.

FIGS. 9A through 9D illustrate transmission characteristics for each element with respect to AWG transmission characteristics. Referring to FIG. 9A, the passband width of the AWG transmission characteristics is about 0.6 nm. Referring to FIG. 9B, the cavity mode spacing (λ2/(2 ngL) (where the operating wavelength λ is 1.55 μm, the group refractive index ng is 3.7, the length of the cavity L is 2 mm) is about 0.16 nm. Referring to FIG. 9C, the ring transmission characteristic spacing (λ2/(neffLring) (where the operating wavelength λ is 1.55 μm, the effective refractive index neff is 3.49, and the ring cavity circumference Lring is 1200 μm) is 0.57 nm. In a conventional long cavity single-mode semiconductor laser, the single-mode selection characteristic in the AWG passband characteristic is dependent on the SOA nonlinear characteristic; however, as described with reference to FIGS. 7A and 7B, by introducing a ring-type waveguide, the ring transmission characteristic affects the single-mode selection, and the ring-type structure of FIG. 8A can increase the single-mode stability significantly.

When the ring cavity circumference in the ring-type structure of FIG. 8A is reduced to increase the ring cavity mode spacing, one ring cavity mode can be disposed in one AWG passband width.

Figure 10:
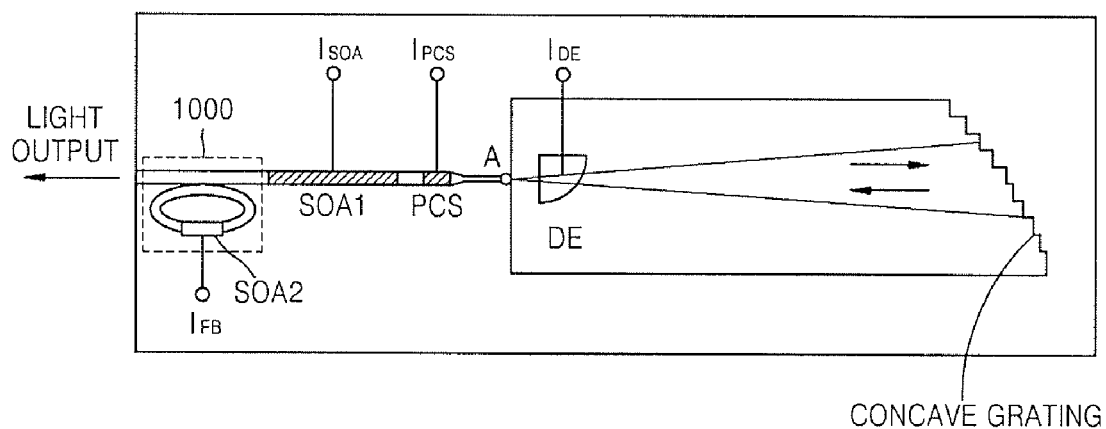
FIG. 10 illustrates a CG-based laser in which a ring-type structure according to an embodiment of the present invention is integrated.
Figure 11:
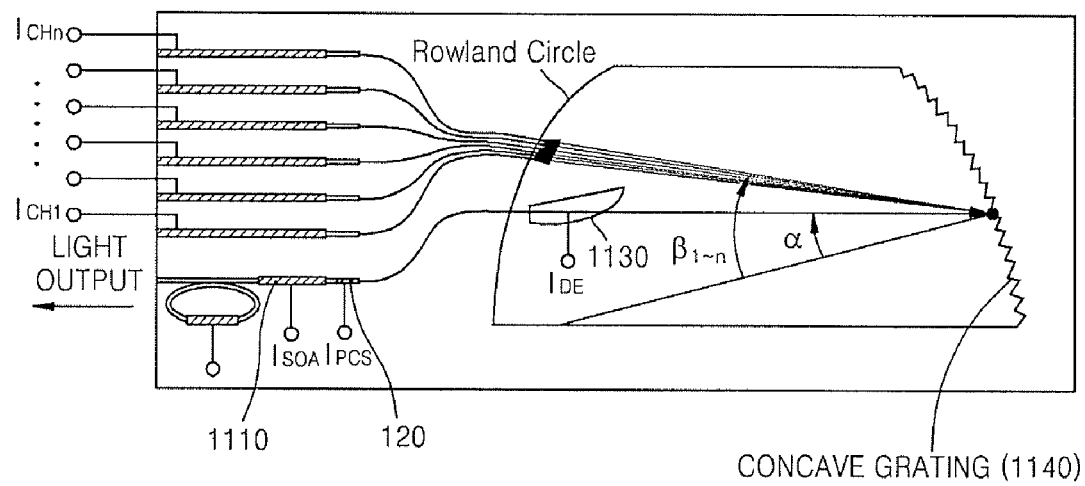
FIG. 11 is a schematic view of a CG-based laser for wavelength variation in which a ring-type structure is integrated according to an embodiment of the present invention.
Figure 12:
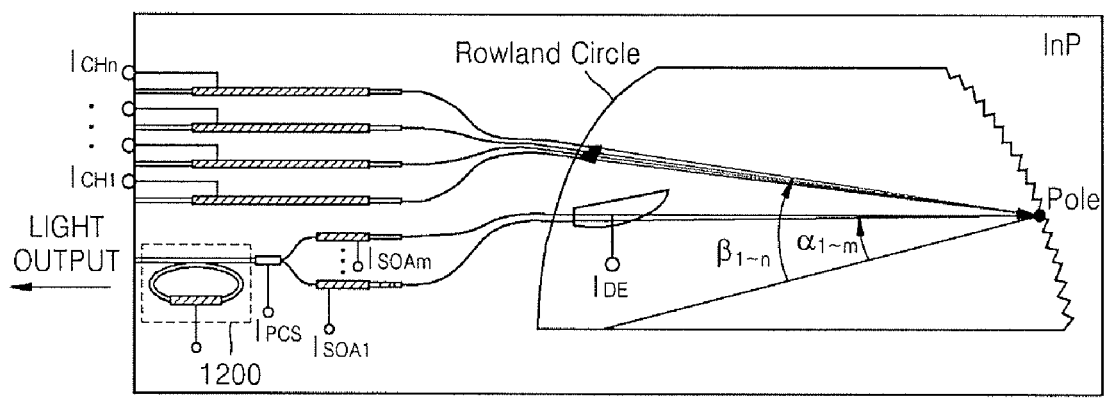
FIG. 12 is a schematic view of a CG-based laser for wavelength variation in which a ring-type structure is integrated according to another embodiment of the present invention.

The ring-type structure according to the present invention can be integrated in various types of long cavity single-mode lasers as illustrated in FIGS. 10 through 12 besides the AWG-based laser of FIG. 6.

FIG. 10 illustrates a CG-based laser in which a ring-type structure 1000 is integrated according to an embodiment of the present invention.

The CG-based laser of FIG. 10 is expected to have excellent wavelength stability similar to the AWG-based laser of FIG. 6. In the wavelength-tunable light source based on the conventional CG-based laser, the wavelength variations and the single-mode stability are in a trade-off relationship according to the variable of structure—that is, the smaller the diffraction order, the longer the grating period, and the shorter the distance between point A to the cross-section of the concave grating, the greater the wavelength variation and the lower the single-mode stability—and thus the wavelength variation should be sacrificed in order to obtain appropriate single-mode stability.

However, referring to FIG. 10, in the CG-based laser in which the ring-type structure 1000 is integrated according to the current embodiment of the present invention, mode stability is increased significantly, and thus broad wavelength variation amount can be obtained. FIG. 11 illustrates a CG-based laser for wavelength variation in which a ring-type structure is integrated according to an embodiment of the present invention.

Referring to FIG. 11, the CG-based laser for wavelength variation has an optical amplifier and an array structure including various channels (each channel is an optical amplifier). The CG-based laser of FIG. 11 operates independently for each of n wavelengths according to the number of channels n, and the operating principle thereof is as follows.

Beams emitted from an SOA 1110 pass a PCS 1120 and a dispersive element (DE) 1130 and are incident on a concave grating 1140 at an incident angle α, and beams corresponding to predetermined wavelengths are reflected back at an angle β to each channel (each channel is an optical amplifier) according to the diffracting characteristic of the concave grating 1140. Different wavelengths are reflected back to each channel.

Since the left cross-section of the SOA 1110 and the left cross-section of the channels of the CG-based laser of FIG. 11 have reflection surfaces, a resonator is formed to operate as a laser diode. Also, as described with reference to FIG. 10, the single-mode characteristic of the emitted optical signals can be improved by inserting a ring-type structure at a left end of the optical amplifier 1110. FIG. 12 illustrates a CG-based laser for wavelength variation in which a ring-type structure 1200 is integrated according to another embodiment of the present invention.

In FIG. 12, m optical amplifiers and n channels are included to operate to n*m wavelengths, unlike in FIG. 11 in which one optical amplifier and n channels are included. The structure of FIG. 12 has the advantage of having a great number of wavelengths. Also, in FIG. 12, the ring-type structure 1200 can be disposed at the left side of the optical amplifiers using a combiner to improve the single-mode stability.

According to the present invention, a long cavity single-mode laser in which a ring-type structure is integrated amplifies and transmits beams at predetermined wavelengths by controlling current of the optical amplifiers disposed in a ring waveguide. Accordingly, the single-mode stability of the long cavity single-mode laser can be increased significantly to increase the reliability and the yield of the device. Also, the light output is increased by the optical amplification characteristic of the optical amplifier disposed in the ring cavity, and not only improvement of the single-mode stability but also broad wavelength variation can be obtained with respect to the wavelength variation laser.

Also, although the ring-type structure according to the present invention is integrated in a long cavity single-mode laser, the size of the device is not changed, and operation and structure to obtain a single-mode is simple, and since the feedback light is amplified by SOA injection current in the ring waveguide, the light output is rather increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A long cavity single-mode laser diode, comprising:
   a first optical amplifier amplifying and outputting beams;
   an array waveguide grating (AWG) separating the beams into a plurality of wavelengths along a waveguide array of the AWG;
   a semiconductor optical amplifier (SOA) array for wavelength selection amplifying light of each of the separated wavelengths; and
   a ring waveguide that is connected to the first optical amplifier and forms a feedback loop and comprises a second optical amplifier in the feedback loop.

2. The long cavity single-mode laser diode of claim 1, further comprising a phase control selection (PCS) that is disposed between the first optical amplifier and the ring waveguide and controls the phase of emitted beams.

3. A long cavity single-mode laser diode, comprising:
   a first optical amplifier amplifying and outputting beams;
   a phase control section (PCS) controlling the phase of the beams;
   a concave grating diffracting the beams in each wavelength according to an incident angle of the beams and reflecting the beams; and
   a ring waveguide that is connected to the first optical amplifier and forms a feedback loop and comprises a second optical amplifier in the feedback loop.

4. The long cavity single-mode laser diode of claim 3, further comprising a dispersion unit that varies the wavelength of beams output from the phase control section (PCS).

5. The long cavity single-mode laser diode of claim 3, wherein the first optical amplifier is formed of at least one optical amplifier array and different wavelengths for each array of the optical amplifier are output.

* * * * *